US011987878B2

(12) United States Patent
Chen et al.

(10) Patent No.: US 11,987,878 B2
(45) Date of Patent: *May 21, 2024

(54) CHEMICAL VAPOR DEPOSITION PROCESSES USING RUTHENIUM PRECURSOR AND REDUCING GAS

(71) Applicant: ENTEGRIS, INC., Billerica, MA (US)

(72) Inventors: Philip S. H. Chen, Bethel, CT (US); Bryan C. Hendrix, Danbury, CT (US); Thomas H. Baum, New Fairfield, CT (US)

(73) Assignee: ENTEGRIS, INC., Billerica, MA (US)

( * ) Notice: Subject to any disclaimer, the term of this patent is extended or adjusted under 35 U.S.C. 154(b) by 48 days.

This patent is subject to a terminal disclaimer.

(21) Appl. No.: 17/744,240

(22) Filed: May 13, 2022

(65) Prior Publication Data
US 2022/0267895 A1 Aug. 25, 2022

Related U.S. Application Data

(63) Continuation of application No. 16/673,470, filed on Nov. 4, 2019, now Pat. No. 11,371,138.

(60) Provisional application No. 62/757,356, filed on Nov. 8, 2018.

(51) Int. Cl.
C23C 16/06 (2006.01)
C23C 16/02 (2006.01)
C23C 16/18 (2006.01)
C23C 18/42 (2006.01)
C23C 18/44 (2006.01)
H01L 21/285 (2006.01)

(52) U.S. Cl.
CPC .............. C23C 16/18 (2013.01); C23C 16/02 (2013.01); C23C 16/06 (2013.01); C23C 18/42 (2013.01); C23C 18/44 (2013.01); H01L 21/28568 (2013.01)

(58) Field of Classification Search
CPC ......... C23C 16/06; C23C 16/14; C23C 16/18; C23C 16/02
See application file for complete search history.

(56) References Cited

U.S. PATENT DOCUMENTS

| 7,074,719 | B2* | 7/2006 | Kim ................. C23C 16/45542 257/E21.171 |
| 7,270,848 | B2 | 9/2007 | Suzuki |
| 7,435,484 | B2 | 10/2008 | Shinriki et al. |
| 9,938,622 | B2 | 4/2018 | Ha |
| 10,906,925 | B2 | 2/2021 | Schmiege |
| 11,371,138 | B2* | 6/2022 | Chen ................. H01L 21/28556 |
| 2003/0129306 | A1 | 7/2003 | Wade |
| 2004/0166671 | A1 | 8/2004 | Lee et al. |
| 2005/0081882 | A1 | 4/2005 | Greer |
| 2005/0186341 | A1 | 8/2005 | Hendrix |
| 2006/0068098 | A1 | 3/2006 | Yamasaki |
| 2006/0165892 | A1* | 7/2006 | Weidman .......... C23C 16/45544 427/248.1 |
| 2006/0211228 | A1 | 9/2006 | Matsuda |
| 2006/0223312 | A1* | 10/2006 | Yonker ............. H01L 21/28562 257/E21.171 |
| 2008/0152793 | A1 | 6/2008 | Gatineau |
| 2009/0238970 | A1 | 9/2009 | Taniuchi |
| 2009/0257170 | A1 | 10/2009 | Bhat |
| 2010/0055313 | A1 | 3/2010 | Kadota et al. |
| 2010/0095865 | A1* | 4/2010 | Xu .......................... C07F 17/02 106/287.18 |
| 2011/0028749 | A1 | 2/2011 | Akashi |
| 2011/0045171 | A1* | 2/2011 | McFeely .......... H01L 21/02068 427/96.8 |
| 2011/0256721 | A1 | 10/2011 | Gatineau et al. |
| 2012/0277456 | A1 | 11/2012 | Doppiu |
| 2015/0056384 | A1 | 2/2015 | Gatineau |
| 2015/0225437 | A1 | 8/2015 | Harada |
| 2015/0299848 | A1* | 10/2015 | Haukka ................ C23C 16/407 427/256 |
| 2016/0268207 | A1* | 9/2016 | Naik ................ H01L 23/53238 |
| 2017/0352669 | A1* | 12/2017 | Sharangpani .......... H10B 41/40 |
| 2018/0247941 | A1 | 8/2018 | Kim |
| 2018/0252170 | A1 | 9/2018 | Hashimoto |
| 2019/0185993 | A1* | 6/2019 | Chen ...................... C23C 16/04 |
| 2019/0309422 | A1 | 10/2019 | Cooper |

FOREIGN PATENT DOCUMENTS

| CN | 113039309 A | 6/2021 | |
| JP | 2008004786 A | 1/2008 | |
| JP | 2009046440 A | 3/2009 | |
| JP | 2011106008 A | 6/2011 | |
| JP | 2012111696 A | 6/2012 | |
| KR | 20090082543 A | 7/2009 | |
| WO | WO 2008/088563 A2 * | 7/2008 | .............. C07F 17/00 |
| WO | 2018061965 A1 | 4/2018 | |

OTHER PUBLICATIONS

Goswami, Jaydeb, et al., "Selective Deposition of Ruthenium Films by Digital CVD". Chemical Vapor Deposition, 2005, 11, No. 2, pp. 94-98.*
Gaur, Ruchi, et al., "Ruthenium complexes as precursors for chemical vapor-deposition (CVD)". RSC Advances, 2014, 4, 33785-33805.*
Gnerlich, Markus, et al., "Selective deposition of nanostructured ruthenium oxide using Tobacco mosaic virus for microsupercapacitors in solid Nafion electrolyte". Journal of Power Sources, 293 (2015) 649-656.*

(Continued)

Primary Examiner — Bret P Chen

(57) ABSTRACT

Chemical vapor deposition (CVD) processes which use a ruthenium precursor of formula $R^1R^2Ru(0)$, wherein $R^1$ is an aryl group-containing ligand, and $R^2$ is a diene group-containing ligand and a reducing gas a described. The CVD can include oxygen after an initial deposition period using the ruthenium precursor and reducing gas. The method can provide selective Ru deposition on conductive materials while minimizing deposition on non-conductive or less conductive materials. Further, the subsequent use of oxygen can significantly improve deposition rate while minimizing or eliminating oxidative damage of the substrate material. The method can be used to form Ru-containing layers on integrated circuits and other microelectronic devices.

20 Claims, 4 Drawing Sheets

(56) References Cited

OTHER PUBLICATIONS

Mackus, Adriaan, J. M., et al., "From the Bottom-Up: Toward Area-Selective Atomic Layer Deposition with High Selectivity". Chemistry of Materials, 2019, 31, 2-12.*

Kim, Minsu, et al., "Highly Stable and Effective Doping of Graphene by Selective Atomic Layer Deposition of Ruthenium". ACS Applied Materials & Interfaces, 2017, 9, 701-709.*

Bykov, A.F., et al., "Investigation of Thermal Properties of Ruthenium(III) B-Diketonate Precursors for Preparation of RuO2 Films by CVD," Journal of Thermal Analysis, vol. 46 (1996) 1551-1565.

Choi, Sang-Hyeok, et al., "Thermal Atomic Layer Deposition (ALD) of Ru Films for Cu Direct Plating," Journal of The Electrochemical Society, 158 (6) D351-D356, (2011).

Gatineau, J., et al., "A New Liquid Precursor for Pure Ruthenium Depositions," 2007 ECS Trans. 6 (1) 303-307.

Gaur, R. et al., "Ruthenium complexes as precursors for chemical vapordeposition (Cvd)," RSC Adv., 2014, vol. 4, pp. 33785-33805 abstract; p. 33795; figure 9.

Green, M.L., et al., "Chemical Vapor Deposition of Ruthenium and Ruthenium Dioxide Films," J. Electrochem. Soc.: Solid State Science and Technology, vol. 132, No. 11, Nov. 1985, pp. 2677-2685.

Han, Jeong Hwan, et al., "Chemical Vapor Deposition of Ru Thin Films with an Enhanced Morphology, Thermal Stability, and Electrical Properties Using a RuO4 Precursor," Chem. Mater. 2009, 21, 207-209.

Jipa, I, et al., "Methylated [(benzene)(1,3-butadiene)Ru0] Derivatives as Novel MOCVD Precursors with Favorable Properties," Chem. Vap. Deposition, 2011, vol. 17, pp. 15-21 abstract, p. 18.

Kim, Soo-Hyun et al., "Low Temperature Atomic Layer Deposition of Ru Thin Films with Enhanced Nucleation Using Various Ru(0) Metallorganic Precursors and Molecular O2," The Electrochemical Society, 41 (2) 19-23, (2011).

Li, Huazhi, et al., "Vapor Deposition of Ruthenium from an Amidinate Precursor," Journal of The Electrochemical Society, 154 (12) (2007) D642-D647.

Liao, Wen, et al., "Precursor dependent nucleation and growth of ruthenium films during chemical vapor deposition," Journal of Vacuum Science & Technology A 34, 041514 (2016) pp. 1-7.

Mohimi, Elham, et al., "Area selective CVD of metallic films from molybdenum, iron, and ruthenium carbonyl precursors: Use of ammonia to inhibit nucleation on oxide surfaces," Journal of Vacuum Science & Technology A 36, 041507 (2018) pp. 1-8.

Papadatos, Filippos, et al., "Chemical vapor deposition of ruthenium and ruthenium oxide thin films for advanced complementary metal-oxide semiconductor gate electrode applications," J. Mater. Res., vol. 19, No. 10, Oct. 2004, pp. 2947-2955.

Shin, Jinhong, et al., "Growth of Ultrathin Films of Amorphous Ruthenium-Phosphorus Alloys Using a Single Source CVD Precursor", J. Am. Chem. Soc. 2006, 128, 16510-16511.

Smith, K.C., et al., "Evaluation of precursors for chemical vapor deposition of ruthenium," Thin Solid Films 376 (2000) pp. 73-81.

* cited by examiner

CHEMICAL VAPOR DEPOSITION PROCESSES USING RUTHENIUM PRECURSOR AND REDUCING GAS

CROSS REFERENCE TO RELATED APPLICATIONS

This application is a continuation of U.S. Pat. No. 11,371,138 which was filed as U.S. patent application Ser. No. 16/673,470 on Nov. 4, 2019, which claims the benefit of U.S. Provisional Patent Application No. 62/757,356 filed Nov. 8, 2018, the disclosures of each of which are hereby incorporated herein by reference hi their entirety.

FIELD OF THE INVENTION

The invention relates to chemical vapor deposition methods using a ruthenium-containing precursor and reducing gas, and microelectronic articles made therefrom.

BACKGROUND

Ruthenium (Ru) has been used as a material in the fabrication of various microelectronic articles, such as in industrial semiconductor manufacturing. Ruthenium can provide various desirable properties to these types of articles, such as high thermal stability/melting point, low resistivity, etchability, resistance to oxidation, and copper seed enhancement. Ru is considered a possible gate electrode material for complementary metal-oxide-semiconductors (CMOS) as well as capacitors for random-access memory applications such as ferroelectric RAM (FRAM) and dynamic random-access memory (DRAM) applications.

Various depositions techniques have been used to deposit materials, such as Ru, during the formation microelectronic articles that are useful for their function. These deposition processes are often used to form a thin film of the material on a portion of the microelectronic substrate. Exemplary techniques include Chemical Vapor Deposition (CVD), Atomic Layer Deposition (ALD), evaporation deposition, and Molecular Beam Epitaxy (MBE). CVD is a popular technique for the deposition of Ru. In a typical CVD process, metals such as ruthenium are complexed in the form of volatile metal precursors which react or decompose on the substrate surface to form a deposit of the metal, and generally resulting in the formation of volatile by-products which are removed from the deposition chamber using gas flow.

Ru thin films formed from precursors and deposition processes such as CVD are desirable as an adhesion layer for a copper diffusion barrier (TiN/TaN) layer, a diffusion barrier layer, and a seed layer for Cu electrochemical plating (ECP). However, the deposition of Ru on substrates using Ru precursors and CVD deposition can be a technically challenging process and also lead to undesired results. Ruthenium precursors including those using carbonyl, diketonate, and other organometallic chemistries can require an oxidizing compound for successful deposition of Ru on the target substrate. For example, the use of oxidizing compounds can be counterproductive especially when they change the properties or damage other materials of other materials of the substrate. The presence of an oxidant can lead to oxidation damage of an under-laying nitride film leaving it as a less conductive interface.

Despite many superior aspects of CVD methods generally, prior techniques have not been successful at depositing ruthenium on certain underlying layers, such as copper layers. Thus, there is a need in the art for depositing ruthenium on thin metals layers to achieve the benefits of ruthenium without the deleterious effects described above.

SUMMARY

The invention relates to methods and compositions for depositing ruthenium on a substrate material in a chemical vapor deposition (CVD) process. CVD methods of the invention use certain ruthenium precursor chemistries in combination with a reducing gas to provide selective and high quality ruthenium deposition as well as desirable processing conditions. Also, CVD methods of the invention at the same time minimize or eliminate damage to substrate materials that would otherwise occur through undesirable oxidation. The process and composition of the disclosure can be used in the fabrication of microelectronic articles like integrated circuits (ICs), such as in industrial semiconductor manufacturing, to provide barrier material or liner between a low k dielectric material and a conductive interconnect material.

In one embodiment, the invention provides a method for depositing ruthenium on a substrate material using CVD. The CVD method includes steps of vaporizing a ruthenium precursor of the formula $R^1R^2Ru(0)$, wherein $R^1$ is an aryl group-containing ligand, and $R^2$ is a diene group-containing ligand and contacting a substrate with the vaporized ruthenium precursor and a reducing gas, wherein ruthenium is deposited on the substrate.

In the ruthenium precursor $R^1$ is preferably a mono-, di-, or tri-alkylbenzene (e.g., cymene), and $R^2$ is preferably a cyclic unconjugated diene, such as cyclohexadiene or an alkylcyclohexadiene. The ruthenium precursor of the formula $R^1R^2Ru(0)$ can be present in an organic solvent which can facilitate the CVD process to form a ruthenium-containing layer on a conductive substrate.

The combination of the ruthenium precursor of the formula $R^1R^2Ru(0)$ along with the reducing gas such as hydrogen, can allow the selective deposition of ruthenium on certain material(s) of the substrate, such as a conductive material (e.g., tungsten-, titanium-, copper-, or aluminum-containing) substrate feature while minimizing deposition on other material(s), such as those that are non-conductive or less conductive than the conductive material (e.g., a silicon-, and/or oxygen-containing material). The rate of deposition of ruthenium on a conductive material of a substrate can be at least 2× or greater than the rate of deposition on a non-conductive or less conductive material.

The method can preferably include a step of contacting the substrate with oxygen after introduction of the ruthenium precursor and the reducing gas. In an initial step without oxygen, a thin ruthenium layer is formed on the substrate using the ruthenium precursor and reducing gas. Following formation of the thin layer, oxygen is introduced along with the ruthenium precursor and reducing gas to enhance ruthenium deposition. The deposition method can include pulsing oxygen into the deposition chamber.

In embodiments, the substrate includes an integrated circuit, which can be partly formed from a material that is non-conductive or less conductive than the conductive feature, such as a di-electric. In the integrated circuit the conductive feature (e.g., copper-containing) can be an interconnect, such as a line or a via, that functions to conduct electric current among and between various electronic features of the integrated circuit. The deposited ruthenium can be in the form as a single layer functioning as a liner or a barrier layer between a conductive interconnect material and a low k dielectric material. Therefore, in another aspect, the invention relates to an integrated circuit prepared using the method including the ruthenium precursor of the formula $R^1R^2Ru(0)$ along with the reducing gas such as hydrogen, such as according to methods described herein.

Beneficially, the method using the ruthenium-containing precursor of the current disclosure along with a reducing gas can result in very good nucleation of a substrate with formation of high quality ruthenium films, with minimal carbon left on the substrate following deposition. Further, since little or no oxygen is present at least during an initial deposition stage, the deposition method can provide an oxygen-free interface, thereby avoiding formation of an oxide layer that would otherwise result in an increase in contact resistance.

In other embodiments, the invention provides a system for CVD for depositing ruthenium on a substrate which includes a ruthenium source comprising a ruthenium precursor of the formula $R^1R^2Ru(0)$, wherein $R^1$ is an aryl group-containing ligand, and $R^2$ is a diene group-containing ligand; and a gas supply source comprising a reducing gas. The system can be in the form of a CVD apparatus which can include features, such as a deposition chamber, a substrate support, carrier gas source (if other than hydrogen), conduit(s), etc.

DETAILED DESCRIPTION

Figure 1A:
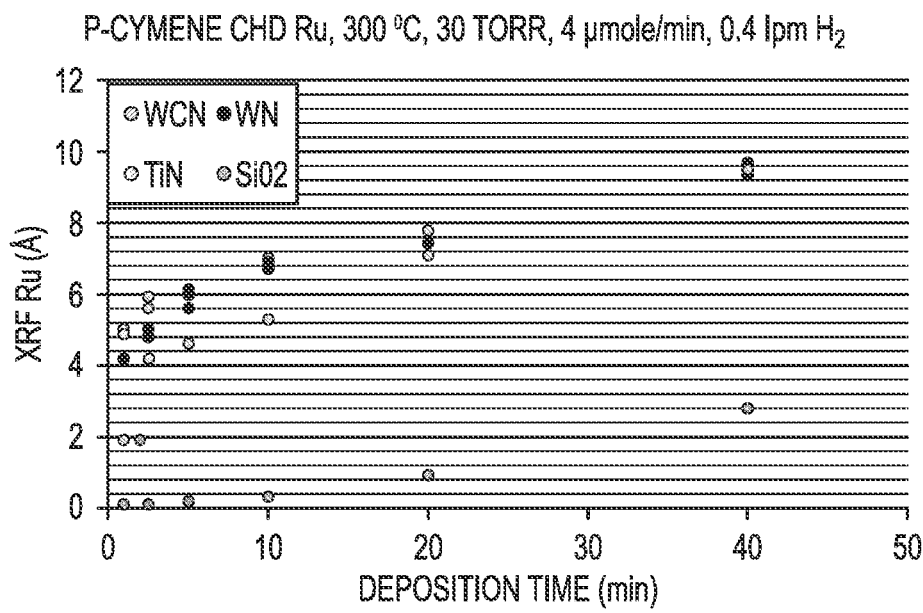
FIG. 1A is a graph of ruthenium deposition and selectivity on various substrates.

The present disclosure relates to chemical vapor deposition (CVD) methods using ruthenium precursors of the formula $R^1R^2Ru(0)$ which are configured for use along with a reducing gas such as hydrogen. Disclosed herein are also CVD systems that include sources for the ruthenium precursor and reducing gas, and optionally oxygen, configured for use in a deposition process. The present disclosure also relates to methods for forming a ruthenium-containing layer on a conductive surface, and substrates formed therefrom. The present disclosure also relates to methods for forming integrated circuits which use the precursors of the disclosure, as well as the integrated circuits that are formed as a result of the process.

Ruthenium-containing precursors of the disclosure include compounds of the Formula I $R^1R^2Ru(0)$, wherein $R^1$ is benzene or an aryl group-containing ligand, and $R^2$ is a diene group-containing ligand. As used herein, an "aryl group-containing ligand" includes at least one aromatic ring with one or more hydrocarbon substituents attached to the aromatic ring. For example, the aryl group-containing ligand can be a mono-, di-, or tri-alkylbenzene, or a fused ring structure such as indane or tetrahydronaphthalene (benzocyclohexane, tetralin).

The ligands $R^1$ and $R^2Ru(0)$ include one or more electron pairs and their molecular orbital(s) overlap with the orbitals of the ruthenium ion, thereby providing electronic bonding between the ligands and the ruthenium. In the line-angle (skeletal) structures of the disclosure, the bond lines between Ru and portion(s) of the ligands represent this electronic bonding.

As used herein a "diene group-containing ligand" is a compound including at least two carbon-carbon double bonds separated by at least one carbon-carbon single bond, and can include conjugated dienes and unconjugated dienes, with conjugated dienes being preferred. Diene group-containing ligands can optionally include more than two carbon-carbon double bonds, such as trienes. Diene group-containing ligands include linear and cyclic compounds, with cyclic compounds being preferred. Cyclic diene group-containing ligands can have a single ring structure, such as cyclohexadiene, cyclohexadiene, or alkylated derivatives thereof, or can have a fused cyclic ring structure, such as hexahydronaphthalene, thetrahydroindene, dicyclopentadiene, or norbornadiene.

For example, $R^1$ can be selected from the group consisting of toluene, xylene, ethylbenzene, cumene, and cymene. In embodiments, $R^2$ can be a cyclic or linear unconjugated diene. Preferably, $R^2$ is cyclohexadiene or an alkylcyclohexadiene. For example, $R^2$ can be selected from the group consisting of cyclohexadiene, methylcyclohexadiene, ethylcyclohexadiene, and propylcyclohexadiene.

Exemplary ruthenium-containing precursors of the disclosure include compounds of the formula II:

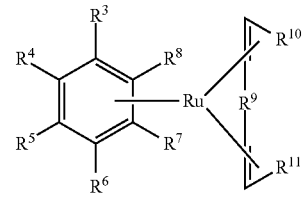

wherein one or more or $R^3$-$R^8$ are selected from H and C1-C6 alkyl, $R^9$ is 0 (covalent bond) or a divalent alkene group of 1-4 carbon atoms, and $R^{10}$ and $R^{11}$ form one or more ring structures or are selected from H and C1-C6 alkyl. Preferably, one, two, or three of $R^3$-$R^8$ are selected from C1-C6 alkyl, or more preferably C1-C3 alkyl, with the remaining $R^3$-$R^8$ being H. Preferably, $R^9$ is 0 (covalent bond), and $R^{10}$ and $R^{11}$ form one or more ring structures.

In some embodiments, the ruthenium precursor of the formula $R^1$ and $R^2$ does not include any heteroatoms (i.e., an atom other than carbon or hydrogen). For example, $R^1$ and $R^2$ can consist of carbon and hydrogen. Compounds of formula $R^1R^2Ru(0)$ can also be described in terms of their degree of unsaturation, their total carbon atom content, their total hydrogen content, or combinations thereof.

For example, the ruthenium precursor of the formula $R^1R^2Ru(0)$ can have a total carbon atom amount in the range of (a1) 12 to 20, in the range of (a2) 14 to 18, or in the range of (a3) 15 to 17. A preferred ruthenium precursor has a total carbon atom amount of (a4) 16. The ruthenium precursor of the formula $R^1R^2Ru(0)$ can also have a total hydrogen atom amount in the range of (b1) 16 to 28, in the range of (b2) 19 to 25, or in the range of (b3) 20-24. A preferred ruthenium precursor has a total hydrogen atom amount of 22. The ruthenium precursor can have combined carbon and hydrogen amounts of (a1) and (b1), (a2) and (b2), or (a3) and (b3).

Exemplary compounds of formula $R^1R^2Ru(0)$ include, but are not limited to, (cymene)(1,3-cyclohexadiene)Ru(0), (cymene)(1,4-cyclohexadiene)Ru(0), (cymene)(1-methylcyclohexa-1,3-diene)Ru(0), (cymene)(2-methylcyclohexa-1,3-diene)Ru(0), (cymene)(3-methylcyclohexa-1,3-diene)Ru(0), (cymene)(4-methylcyclohexa-1,3-diene)Ru(0), (cymene)(5-methylcyclohexa-1,3-diene)Ru(0), (cymene)(6-methylcyclohexa-1,3-diene)Ru(0), (cymene)(1-methylcyclohexa-1,4-diene)Ru(0), (cymene)(2-methylcyclohexa-1,4-diene)Ru(0), (cymene)(3-methylcyclohexa-1,4-diene)Ru(0), (cymene)(4-methylcyclohexa-1,4-diene)Ru(0), (cymene)(5-methylcyclohexa-1,4-diene)Ru(0), and (cymene)(6-methylcyclohexa-1,4-diene)Ru(0). Cymene is also known as 1-Methyl-4-(propan-2-yl)benzene or 1-isopropyl-4-methylbenzene.

Exemplary compounds of formula $R^1R^2Ru(0)$ also include, but are not limited to, (benzene)(1,3-cyclohexadiene)Ru(0), (toluene)(1,3-cyclohexadiene)Ru(0), (ethylbenzene)(1,3-cyclohexadiene)Ru(0), (1,2-xylene)(1,3-cyclohexadiene)Ru(0), (1,3-xylene)(1,3-cyclohexadiene)Ru(0), (1,4-xylene)(1,3-cyclohexadiene)Ru(0), (p-cymene)(1,3-cyclohexadiene)Ru(0), (o-cymene)(1,3-cyclohexadiene)Ru(0), (m-cymene)(1,3-cyclohexadiene)Ru(0), (cumene)(1,3-cyclohexadiene)Ru(0), (n-propylbenzene)(1,3-cyclohexadiene)Ru(0), (m-ethyltoluene)(1,3-cyclohexadiene)Ru(0), (p-ethyltoluene)(1,3-cyclohexadiene)Ru(0), (o-ethyltoluene)(1,3-cyclohexadiene)Ru(0), (1,3,5-trimethylbenzene)(1,3-cyclohexadiene)Ru(0), (1,2,3-trimethylbenzene)(1,3-cyclohexadiene)Ru(0), (tert-butylbenzene)(1,3-cyclohexadiene)Ru(0), (isobutylbenzene)(1,3-cyclohexadiene)Ru(0), (sec-butylbenzene)(1,3-cyclohexadiene)Ru(0), (indane)(1,3-cyclohexadiene)Ru(0), (1,2-diethylbenzene)(1,3-cyclohexadiene)Ru(0), (1,3-diethylbenzene)(1,3-cyclohexadiene)Ru(0), (1,4-diethylbenzene)(1,3-cyclohexadiene)Ru(0), (1-methyl-4-propylbenzene)(1,3-cyclohexadiene)Ru(0), and (1,4-dimethyl-2-ethylbenzene)(1,3-cyclohexadiene)Ru(0).

Chemical structures of exemplary compounds of formula $R^1R^2Ru(0)$ are shown below:

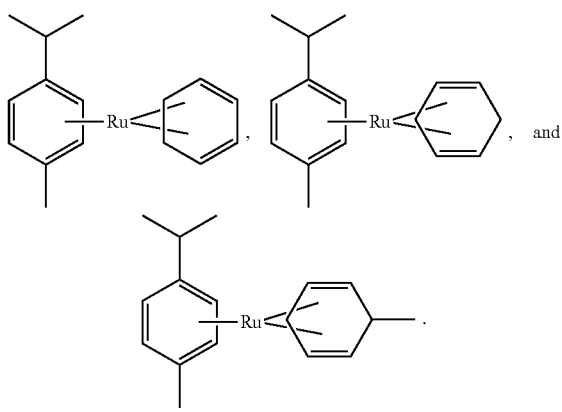

Ruthenium-containing precursors of Formula I $R^1R^2Ru(0)$ can also be described with reference to the melting and/or boiling point of the compound. In embodiments, the ruthenium-containing precursor is a liquid at room temperature (25° C.). For example, the ruthenium-containing precursor may also have a boiling point in a temperature range of about 100° C. to about 175° C., or more specifically about 120° C. to about 150° C.

If the ruthenium-containing precursor of Formula I is in the form of a liquid at room temperature (25° C.), it can be described in terms of its vapor pressure. The vapor pressure of a liquid is the equilibrium pressure of a vapor above its liquid. The pressure of the vapor results from evaporation of the liquid as measured in a closed container at a certain temperature. For example, the precursor may have a vapor pressure at 100° C. of at least about 0.01 Torr, or at least about 0.05 Torr, such as in the range of about 0.05 Torr to about 0.50 Torr, or in the range of about 0.1 Torr to about 0.30 Torr.

Ruthenium-containing precursors of Formula I $R^1R^2Ru(0)$ can be made by reacting a ruthenium-containing reactant, such as a ruthenium salt hydrate, with a first hydrocarbon-containing ligand (R1), forming an intermediate, and then reacting the intermediate with a second hydrocarbon-containing ligand (R2) to form the final product. For example, Eom, T.-K., et al. (Electrochemical and Solid State Letters, 12:D85-D88, 2009) prepared (6-1-isopropyl-4-methylbenzene)-(4-cyclohexa-1,3-diene)Ru(0) (IMBCHRu) by preparing an ethanol solution of ruthenium trichloride hydrate and a-terpene, refluxing for 5 hours, to form a microcrystaline product of m-chloro-bis(chloro(1-isopropyl-4-methylbenzene)ruthenium(II)), which was then dried and then added to a solution of ethanol with Na2CO3, and 1,3-cyclohexadiene, and then refluxed for 4.5 hours.

The disclosure provides methods for forming a ruthenium-containing layer on a conductive material which involves providing a substrate comprising a conductive feature and using a ruthenium-containing precursor of the disclosure or composition that includes such a precursor in a chemical vapor deposition process to form a ruthenium-containing layer on the conductive feature. The conductive feature can be a part of an integrated circuit, which generally includes one or more materials that are dielectrics that are non-conductive or less conductive than the conductive feature. In the integrated circuit the conductive feature (e.g., copper-containing) can be an interconnect, such as a line or a via, that function to conduct electric current among and between various electronic features of the integrated circuit. The dielectric of the integrated circuit can include a silicon-containing material, and oxygen-containing material, or both, such as silicon dioxide. Another example of a silicon-containing material is silicon nitride (SiN).

The ruthenium-containing layer can be in the form of a thin film which can be formed using a chemical vapor deposition method as known in the art. In chemical vapor deposition (CVD), the substrate is generally exposed to a volatile chemical precursor. The chemical precursor decomposes, or reacts with, the surface of the substrate thereby depositing a chemical moiety of the precursor (e.g., a metal moiety) surface to produce the desired deposit. CVD can produce volatile by-products, and these can be removed from the deposition chamber using a gas flow. CVD can be performed at atmospheric pressures, but is more commonly performed at sub-atmospheric pressures, including very low sub-atmospheric pressures, such as less than about $10^{-6}$ Pa, or less than about $10^{-7}$ Pa. CVD techniques can include direct liquid injection CVD where liquid precursors or solid precursors dissolved in a solvent are injected and vaporized using injectors to provide the chemical precursor in vapor form in a deposition chamber. Deposition apparatus can also include features such as a sonicator which can be used to help generate aerosol ultrasonically, wherein the aerosol includes the chemical precursor. Other CVD techniques such as pulsed chemical vapor deposition or thermal CVD deposition can be used. CVD apparatus can also include a power source to heat the chamber which can in turn heats the precursor and substrate, or a filament that can heat the chemical precursor and cause it volatilization and/or decomposition.

Prior to the step of deposition of the ruthenium-containing precursor on the substrate, the substrate can optionally be pretreated, such as pretreated with a reducing gas. In embodiments, methods of the disclosure can include a step of treating the substrate with a gas mixture that includes a reducing gas such as $H_2$, $NH_3$, hydrazine, or a mixture thereof, prior to using the ruthenium-containing precursor in the deposition process. Pretreatment with the gas ($H_2$ and/or $NH_3$) can be carried out at a temperature in the range of 150-400° C., or 250-350° C. Further, any pretreatment using a reducing gas such as $H_2$ and/or $NH_3$ (a) a flow rate in the range of 100-600 sccm, (b) a chamber pressure in the range of 1-50 Torr, (c) a treatment time in the range of 1-10 minutes, or a combination of any two or more or (a)-(c).

The ruthenium-containing precursor of the disclosure can be introduced into a deposition chamber in vapor form, wherein the substrate in the chamber. In some modes of practice, the ruthenium-containing precursor in vapor form can be generated by vaporizing a composition in liquid form that includes the precursor. Vaporization of the precursor can be achieved by a process such as distillation, vaporization, or bubbling an inert gas such as argon or helium through the liquid composition, wherein the ruthenium-containing precursor, and any optional inert gas, is introduced into the deposition chamber.

Optionally, and in some embodiments, if the ruthenium-containing precursor is in solid or semisolid form, it can be heated to a temperature that melts the precursor so it is in liquid form and generates a vapor pressure adequate for use in the deposition process. For example, the ruthenium-containing precursor can be heated in a container to a temperature of greater than 25° C., such as a temperature in the range of 25° C. to about 150° C., or in the range of 30° C. to about 125° C. The ruthenium-containing precursor can be heated prior to or during a step of vaporizing the ruthenium containing precursor during introduction into the deposition chamber. Pre-heating the ruthenium-containing precursor can optionally be performed even if the precursor is in liquid form (e.g., at 25° C.).

The deposition chamber can include a substrate onto which a ruthenium-containing layer, such as a thin film, will form. In embodiments of the disclosure, the substrate in the deposition chamber is one that is formed into an integrated circuit (IC). The conductive feature on which the ruthenium-containing layer can form can be a conductive interconnect. Conductive interconnects such as those commonly referred to as "lines" or as "vias" are features of integrated circuit devices that provide electronic connection between other structures of the integrated circuit device. The interconnects are formed by first placing a low k dielectric material on an IC substrate, then forming openings (also referred to as "trenches" or "holes") in the low k dielectric material that will define location, size, and shape of the lines and vias. After the openings are formed, a conductive material (e.g., copper, aluminum, tungsten, gold, silver, or an alloy thereof) is eventually deposited onto the substrate by a method that is effective to cause the conductive material to fill the openings.

A conductive material of an interconnect (i.e., an "interconnect material" or "conductive interconnect material") may generally be any conductive material that is known at present or in the future to be useful as a conductive interconnect material; examples include aluminum (Al), tungsten (W), ruthenium (Ru), molybdenum (Mo), copper (Cu), cobalt (Co), gold (Au), silver (Ag), etc., as well as alloys of any one or more of these. In a preferred aspect of the disclosure, the interconnect material includes copper, or is essentially made of copper. In embodiments, the ruthenium-containing precursor is deposited on a conductive feature to form a barrier layer or liner (sometimes referred to as a "ruthenium liner"). A ruthenium liner contacts the conductive interconnect material, and can function as a single layer barrier and liner. The ruthenium liner can separate the conductive feature from a low k dielectric material which is also part of the integrated circuit. Optionally, the integrated circuit can optionally include other barrier or liner materials, such as tantalum and tantalum nitride. The ruthenium liner can be in contact with the conductive (e.g., copper) material, the low k dielectric material, and optionally any other barrier or liner materials. The ruthenium liner can prevent any migration of conductive material of the interconnect into the low k dielectric material, which in turn prevents fouling of the integrated circuit. As an example, a thickness of a ruthenium liner may be in a range from about 0.6 to 6 nanometers, e.g., from about 1 to 3 nanometers. Preferably, the liner layer can be formed as a continuous ruthenium layer or continuous thin film.

A low k dielectric material is a dielectric material having a dielectric constant that is below about 3.9, e.g., below 3.0, e.g., a low k dielectric material may be considered a dielectric material that has a dielectric constant in a range from about 2.7 to about 3.0. An ultra-low k dielectric material (ULK) may be considered to be a low k dielectric material that has a dielectric constant in a range from about 2.5 to about 2.7. A dense ultra-low k dielectric material (DLK) may be considered to be a low k dielectric material that has a dielectric constant that is below about 2.5, possibly below about 2.3, for example in a range from about 2.3 to about 2.5.

Examples of each of these types of low k dielectric materials are known and available in the semiconductor and integrated circuits arts, with various examples including silicon-based low k dielectric materials and organic low k dielectric materials. Certain non-limiting examples of low k dielectric materials include materials known in the semiconductor and integrated circuit arts as: carbon-doped silicon oxides, fluorine-doped silicon oxides, a hydrogen-enriched silicon oxycarbide (SiCOH); porous silicon oxides, porous carbon-doped silicon oxides, porous SiLK™ spin-on silicone based polymeric dielectrics such as methyl silsesquioxane (MSQ) and hydrogen silsesquioxane (HSQ), and spin-on organic polymeric dielectrics.

In other embodiments the ruthenium-containing precursor can be used to form a ruthenium-containing layer in association with a device that is different than an integrated circuit, such as one that is different and used with a semiconductor-containing device, or that is part of a, flat panel or LCD device, or that is a photovoltaic device. Such devices can include materials such as silicon-containing materials such as silica, silicon nitride, carbon doped silica, silicon oxy nitride, and/or conductive materials such as copper, and copper alloys, or noble metals such as gold, platinum, palladium, and rhodium. Materials such as titanium (Ti), such as in the form of titanium nitride (TiN), tantalum (Ta), such as in the form of tantalum nitride (TaN), and tungsten (W), such as in the form of tungsten nitride (WN), or tungsten carbonitride (WCN), can be included in such devices. Substrates that the ruthenium-containing layer can be formed can include layers or architectures that contain any of these materials.

During the process of depositing, the ruthenium containing precursor can be volatilized to a gas and flowed into the deposition chamber at a desired flow rate. The rate of flow of the ruthenium containing precursor gas can be maintained at a constant flow rate, or optionally fluctuated during the deposition process. For example, the flow rate of the ruthenium containing precursor gas can be about at least 0.5 μmol/min, such as in the range of about 0.5 μmol/min to about 25 μmol/min, about 0.75 μmol/min to about 15 μmol/min, about 1 μmol/min to about 10 μmol/min, or about 2 μmol/min to about 8 μmol/min.

During at least an initial period during the process of depositing ruthenium, a reducing gas, $H_2$, $NH_3$, or a mixture thereof, is introduced into the deposition chamber along with the ruthenium-containing precursor gas. In exemplary modes of practice, the reducing gas can be introduced into a deposition chamber at a rate in the range of about 0.05 L/min to about 5 L/min, at a rate in the range of about 0.1 L/min to about 2 L/min, or at a rate in the range of about 0.2 L/min to about 1 L/min.

The amounts of ruthenium-containing precursor and reducing gas that are introduced into the deposition chamber can optionally be described with reference to the ratio of the amounts of ruthenium precursor and the reducing gas. In modes of practice, the ruthenium precursor and the reducing gas are present in mixture in amounts in the range of about 1 μmol: 1 L to about 100 μmol: 1 L; in mixture in amounts in the range of about 2.5 μmol: 1 L to about 50 μmol: 1 L; in mixture in amounts in the range of about 5 μmol: 1 L to about 25 μmol: 1 L; or in mixture in amounts in the range of about 8 μmol: 1 L to about 15 μmol: 1 L, respectively.

In some modes of practice, the ruthenium precursor and reducing gas are flowed into the chamber using separate supply lines, and mixing of the ruthenium precursor and reducing gas occurs in the chamber. In other modes of practice, the ruthenium precursor and reducing gas are mixed prior to flowing into the chamber, such as in a supply line, or in a gas mixing vessel, prior to being delivered to the deposition chamber.

Introduction of the ruthenium-containing precursor gas, the reducing gas, and optionally any other additional gas (e.g., oxygen, and/or an inert gas, such as argon) can be carried out in a continuous or a semi-continuous manner. In preferred modes of practice, the ruthenium-containing precursor gas and the reducing gas are introduced in a continuous flow. In a continuous flow, the ruthenium-containing precursor gas and the reducing gas can be delivered at a constant flow rate, or alternatively, the flow rate can be varied during delivery. In another alternative mode of delivery, the ruthenium-containing precursor gas, the reducing gas, and/or any secondary gas can be introduced into the deposition chamber in a pulsed manner. Pulses may last for a very brief period of time (e.g., a fraction of a second) to tens of seconds.

In some modes of practice, the reducing gas is introduced into the deposition chamber for a period of time prior to introduction of the ruthenium-containing precursor, as in a pre-treatment step as described herein. While the reducing gas is flowing into the chamber, the deposition process can be initiated by beginning a flow ruthenium-containing precursor into the chamber at a desired point during the flow of the reducing gas. After starting the flow of the ruthenium-containing precursor into the chamber, the flow of the reducing gas may be kept the same or may be adjusted. The deposition process can also be commenced by beginning the flows of ruthenium-containing precursor and reducing gas at the same time.

The ruthenium-containing precursor and reducing gas can be flowed into the chamber for a very short period of time (e.g., seconds) to longer periods of time (tens of minutes, an hour or two), in a continuous or semi-continuous manner. For example, the period of time can be in the range of about 5 seconds to 1 hour, about 30 seconds to about 30 minutes, or about 1 minute to about 10 minutes. The reducing gas can be flowed along with the ruthenium-containing precursor for all of the deposition process or for a portion of the deposition process. Also, the flows of ruthenium-containing precursor and reducing gas can be adjusted in any desired manner during the deposition process. For example, the flow rate of ruthenium-containing precursor can be increased or decreased, and/or the flow rate of the reducing gas can be increased or decreased during the course of the deposition process. In one mode of practice, after a period of time of flowing both the ruthenium-containing precursor and reducing gas into the chamber, the flow of reducing gas can be decreased or stopped.

An inert gas, such as argon or helium, can optionally be introduced into the deposition chamber during introduction of the ruthenium-containing precursor gas and the reducing gas. The rate of flow of the inert gas can be maintained at a constant flow rate, or optionally fluctuated during the deposition process. In exemplary modes of practice, the flow rate of the inert gas is in the range of 100-1000 sccm.

During a deposition process, oxygen can be introduced into the deposition chamber after a period of time following the introduction of the ruthenium precursor and the reducing gas. Desirably, the ruthenium precursor is deposited for a period of time sufficient for the formation of at least an extremely thin layer (e.g., in the range of about 0.5 nm to 2 nm) of ruthenium on the substrate. Such a period of time may be seconds, or tens of seconds, to minutes or tens of minutes. Exemplary initial deposition using the ruthenium precursor and reducing gas can be for a period in the range of about 30 seconds to about 20 minutes, or more preferably about 1 minute to about 10 minutes. The formation of a thin ruthenium layer can prevent oxygen, which is introduced after the initial introduction of ruthenium precursor and the reducing gas, from reacting with substrate material and forming an oxidized layer which otherwise fouls the device. However, oxygen that is introduced after this initial period can enhance deposition of the ruthenium precursor on the initial formed layer, thereby enhancing the deposition rate and improving the deposition process.

In some modes of practice, oxygen is introduced into the deposition chamber in an intermittent manner. For example, in a deposition process the ruthenium precursor and the reducing gas are introduced at a constant rate, and then after an initial period of time oxygen is flowed into the chamber for a period of time and then the flow is stopped. The period of time that oxygen is flowed into the chamber can be referred to as a "pulse," and the time of pulse can range of about a fraction of a second to tens of seconds or minutes. Exemplary initial deposition periods are in the range of about 0.1 seconds to about 30 seconds, or more preferably about 0.5 seconds to about 5 seconds, with an exemplary pulse time being 1 or 2 seconds. In exemplary modes of practice, the flow rate of the inert gas can be in the range of about 1 to about 500 sccm (standard cubic centimeters per minute), about 5 to about 100 sccm, or about 10 to about 50 sccm. The flow rate can be determined by operating parameters such as the length of the oxygen pulse, the flow rates of the ruthenium precursor and reducing gas, the deposition temperature, and deposition pressure. The time period of the pulses can be constant over the deposition process, or time period of the pulses can change over the duration of the deposition process. For example, in some modes of practice the duration of the pulses increases over the course of the deposition process. Alternatively, the flow rate of oxygen can change during the pulses over the course of the deposition process.

Alternatively, the deposition process can include a non-intermittent or constant flow of oxygen to the deposition chamber after the initial flow of ruthenium precursor and reducing gas. If a constant flow of oxygen is used a low flow rate can be used, such as less than 25 sccm, or less than 10 sccm. Optionally, the deposition chamber can include a plasma generator to generate gas radicals (e.g., hydrogen radicals) from the one or more reducing gasses that are introduced into the deposition chamber.

During the process of depositing the ruthenium-containing precursor, the temperature within the deposition chamber and the temperature of the substrate can be chosen and controlled to provide a desired vapor deposition of the precursor on the substrate and formation of a ruthenium-containing layer. The deposition chamber can be associated with a heating element to control the temperature during the deposition process. The deposition temperature can be maintained at a constant temperature, or optionally fluctuated during the deposition process. Generally, the deposition chamber is maintained at a temperature greater than about 100° C. For example, the deposition chamber can be maintained during the deposition process at a temperature in the range of 150-400° C., in the range of 200-375° C., in the range of 250-350° C., or in the range of 275-325° C.

The deposition apparatus can include an energy source (e.g. plasma or radio frequency source, microwave sources, or UV light) is provided to aid in the deposition. Examples of reactors include, without limitation, a cold-wall type reactor, a hot-wall type reactor, a single-wafer reactor, a multi-wafer reactor, or other types of deposition systems under conditions suitable to cause the precursors to react and form the layers. Examples of energy sources include microwave sources, UV light sources, and radio frequency (RF) or plasma sources. Any of these reactors may be used for CVD processes and therefore qualify as a CVD reactor.

Further, during the deposition process, the pressure with within the deposition chamber can be chosen and controlled to provide a desired vapor deposition of the precursor on the substrate and formation of a ruthenium-containing layer. The pressure during deposition can be maintained at a constant pressure, or optionally fluctuated during the deposition process. Generally, the deposition chamber is maintained at a pressure of greater than 0.5 Torr, such as a pressure in the range of 0.5-80 Torr, in the range of 2.5-70 Torr, in the range of 5-60 Torr, or in the range of 10-50 Torr.

The deposition apparatus or deposition chamber can also be configured with a port or outlet to allow removal of products from the chamber. The port or outlet can be in gaseous communication with (e.g., connected to) a vacuum pump to allow by products to be removed from the chamber. Pressure within the reaction chamber can also be modulated using the port or outlet.

Deposition of the ruthenium-containing precursor can be carried out for a period of time sufficient to form a desired ruthenium-containing layer on the substrate. The deposition period can vary depending on operating conditions, such as precursor gas flow rate, deposition chamber power, etc. Generally, deposition periods can range from very brief periods, such as seconds, to tens of minutes, and even hours. In exemplary deposition processes, the deposition period is in the range of about 1 minute to about 10 minutes.

Accordingly, the ruthenium-containing layer can form at a desired rate on the substrate. For example, in modes of practice, the ruthenium-containing layer can form at rate of about 2 Å/min or greater, at a rate in the range of about 2 Å/min to about 20 Å/min, or at a rate in the range of 4 Å/min to 15 Å/min. The rate of ruthenium deposition can change over the deposition process, for example from a first slower rate of deposition, to a second faster rate of deposition.

For example, in modes of practice, oxygen is provided to the reaction chamber, such as in a manner as described herein, to increase the rate of deposition of the ruthenium. For example, the rate of ruthenium deposition can increase by about 4× or by about 10× from a first deposition period where using ruthenium and hydrogen, to a second deposition period where using ruthenium, hydrogen, and oxygen. Deposition can be continued to a point where the ruthenium coated layer has desired properties. The thickness of the film can be in the range of several angstroms to hundreds of microns according to the substrate and desired product.

Methods of the disclosure provide improved selectivity towards deposition on conductive (e.g., copper) surfaces during a chemical vapor deposition process. For example, the chemical vapor deposition process using the ruthenium precursor and reducing gas of the disclosure can be carried out at temperatures of about 150° C. or greater, such as in the range of about 150-400° C., with very good selectivity towards deposition on a copper surface versus a non-conductive material such as an oxide surface. Deposition of ruthenium and reducing gas, followed by oxygen during the deposition, can provide more rapid growth rate and formation of a ruthenium-containing layer, which provides distinct processing advantages.

Accordingly, the ruthenium-containing layer can form on the conductive feature at a rate, or in amount, that is greater of the formation of any metal-containing layer on the non-conductive or less conductive feature. For example, in embodiments, the ruthenium-containing layer forms on the conductive feature in an amount that is greater than 10×, 15× or greater, 20× or greater, or 25× or greater, than any amount formed on the non-conductive or less conductive feature.

As deposited, a ruthenium material (e.g., ruthenium layer) may be pure or essentially pure ruthenium (e.g., at least 95, 98, 99, 99.5, or 99.9 percent (atomic) ruthenium). Low levels of impurities may be present in the ruthenium material as deposited. The impurities in the deposited ruthenium can depend largely on the composition of the precursor used, and the level of impurities in a deposited ruthenium material can be affected and desirably controlled by selected deposition conditions. Common impurities include carbon, oxygen, and nitrogen. A total amount of impurities in a ruthenium material as deposited may below about 5 atomic percent, preferably below 2, 1, or 0.5 atomic percent. If desired, as typically is, a post-deposition annealing step may be used to significantly reduce the level of impurities, e.g., carbon, to a carbon level of not greater than about 0.2 atomic percent.

Optionally, the methods of the disclosure which include forming a ruthenium-containing layer on a substrate may further include other integrated circuit formation processes. For example, additional further processing steps can include forming or treating dielectric material. For example, additional processing steps can involve forming openings in the low k dielectric material. Various conventional methods of placing openings in low k dielectric materials are known. The openings, which may be a "trench" or a "hole," may be formed, for example, by use of photoresist and etching processes by which photoresist material is applied to the surface of the low k dielectric material and developed to provide selectivity of locations to be removed or left behind during a subsequent etching step. The photoresist is selectively removed and the openings are formed by the etching step, which can be performed by use of any present or future useful methods and materials. Remaining photoresist can be removed by a "post-etch" cleaning or treatment step by which one or more of a liquid, solvent, surfactant, or plasma, with optional mechanical treatment (e.g., brushes) can be used to remove the remaining photoresist. Some amount of residual photoresist material may still remain at surfaces of the low k dielectric layer, including at the openings, as well as other possible contamination.

Figure 4:
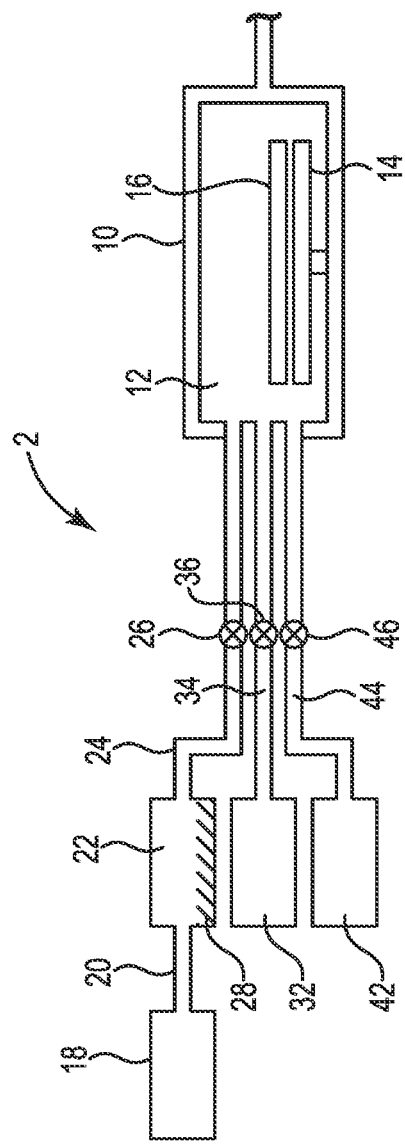
FIG. 4 is a schematic illustration of a CVD system for Ru precursor deposition.

Deposition of ruthenium from a ruthenium-containing precursor of the disclosure can be performed using available vapor deposition equipment and generally understood techniques, adapted for use to deposit ruthenium from a ruthenium-containing precursor as presently described. As a single example of a useful system for a method of the present description, FIG. 4 schematically shows a system that can be useful for carrying out a CVD process as described. Illustrated is chemical vapor deposition system 2, including deposition chamber 10 having interior 12 which contains platen 14, which supports substrate 16. Interior 12 as illustrated is sized to accommodate a single substrate 16, but may be of any size, to contain multiple substrates for CVD processing.

The system can include "flow circuitry" which can include a series of conduits and valves, or other delivery and control mechanisms for delivery of deposition reagents (ruthenium precursor, gasses) from their respective sources to the deposition chamber. The flow of deposition reagents can be manually or electronically controlled to provide desired amounts of the deposition reagents to the deposition chamber.

Still referring to FIG. 4, ruthenium precursor 28 (e.g., in liquid form) is present in a container 22, such an ampoule, wherein the container 22 has an interior with a volume of a size sufficient to contain a desired amount of ruthenium precursor 28 and an amount of additional volume or "headspace," including space above the liquid or solid precursor. Carrier gas source 18 is a source of carrier gas, such as an inert gas like argon. Reducing gas source 32 is a source of reducing gas such as hydrogen. Conduit 20 (e.g., tubing) connects carrier gas source 18 to container 22. Conduit 24 connects container 22 to the interior 12 of deposition chamber 10. In use, carrier gas from carrier gas source 18 can flow through conduit 20 to container 22 where an amount of ruthenium-containing precursor 28, in vapor form, is introduced into the carrier gas. From container 22, the carrier gas carries the precursor 28 vapor (as a carrier gas-precursor mixture) through conduit 24, through valve 26, and into interior 12.

Optionally, precursor 28, present in container 22, can be dissolved in a solvent, e.g., an organic solvent. Various examples of solvents for use with CVD precursors are known, with particular examples including hydrocarbon compounds (including, alkanes, alcohols, ketones, etc.) such as octane, nonane, decane, and ethers such as tetrahydrofuran.

Conduit 34 connects reducing gas (e.g., hydrogen) source 32 to interior 12 of deposition chamber 10. In use, reducing gas from reducing gas source 32 can flow through conduit 34, through valve 36, and into interior 12. In a system such as that of FIG. 4, or an alternate system that is also effective for chemical vapor deposition of the ruthenium-containing precursor as described, deposition processing parameters can be controlled to provide desired properties of a processed substrate. Alternatively, the reducing gas conduit can lead into the precursor conduit (not shown), which can provide mixing of these reagents prior to entering the deposition chamber.

Conduit 44 connects oxygen gas source 42 to interior 12 of deposition chamber 10. In use, oxygen from oxygen gas source 42 can flow through conduit 44, through valve 46, and into interior 12. Alternatively, the oxygen gas conduit can lead into the reducing gas conduit, which can provide mixing of these reagents prior to entering the deposition chamber.

Example 1

CVD Deposition of P-Cymene(1,3-Cyclohexadiene)Ru with $H_2$ Co-Reactant

Ru metal deposited at 300° C. and 30 Torr, using 4 μmole/min P-cymene CHD Ru, and 0.4 lpm $H_2$.

FIG. 1A is a graph demonstrating self-limiting deposition and deposition selectivity for WCN, WN, and TiN over SiO2.

Figure 1B:
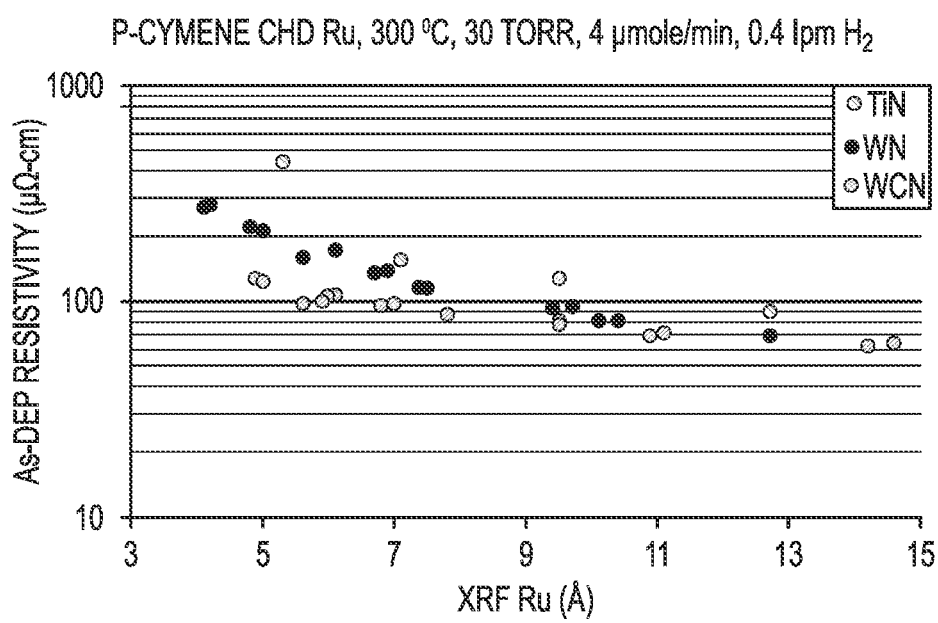
FIG. 1B is a graph showing as-dep resistivity for Ru on various substrates.

FIG. 1B is a graph showing as-dep resistivity for Ru on WCN, WN, and TiN at various thicknesses.

Example 2

CVD Deposition of P-Cymene CHD Ru with $H_2$ and $O_2$ Co-Reactants

Ru metal films deposited at 300° C., 30 Torr using P-cymene CHD Ru with 400 sccm $H_2$, and 400 sccm $O_2$.

Figure 2A:
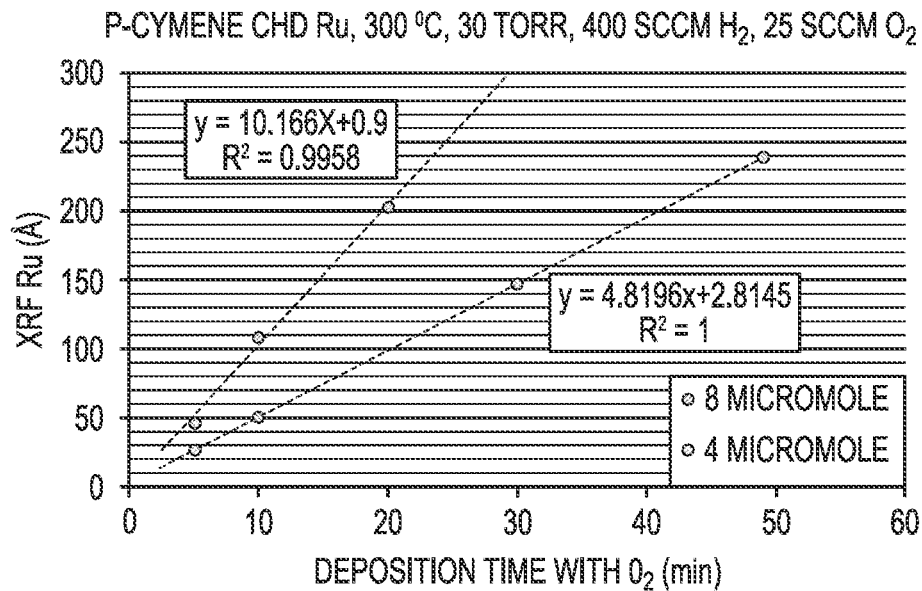
FIG. 2A is a graph of ruthenium deposition using $H_2$ and $O_2$ co-reactants.

FIG. 2A is a graph demonstrating improved deposition rate using $H_2$ and $O_2$ coreactants.

Figure 2B:
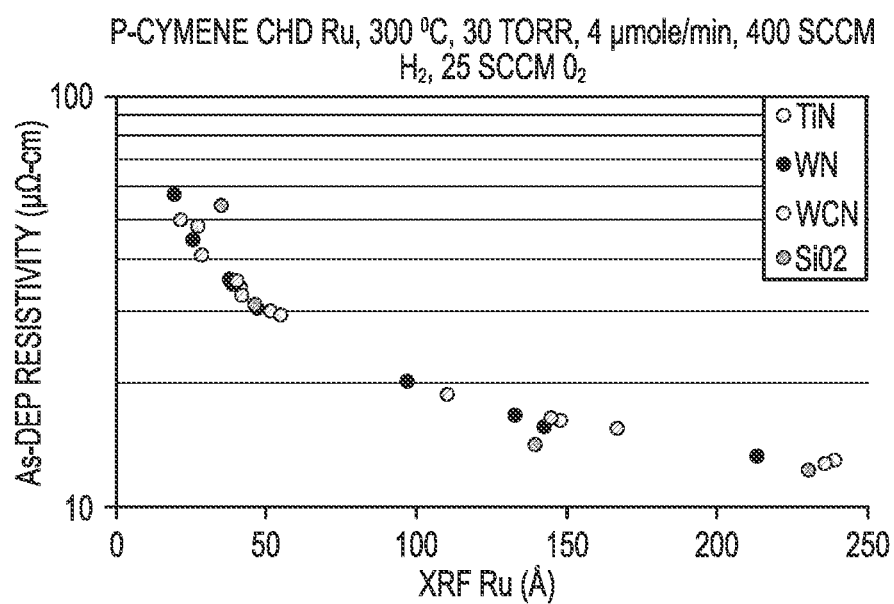
FIG. 2B is a graph showing as-dep resistivity for Ru on various substrates using $H_2$ and $O_2$ co-reactants.

FIG. 2B is a graph showing as-dep resistivity for Ru on WCN, WN, TiN, and $SiO_2$ at various thicknesses.

Example 3

Figure 3A:
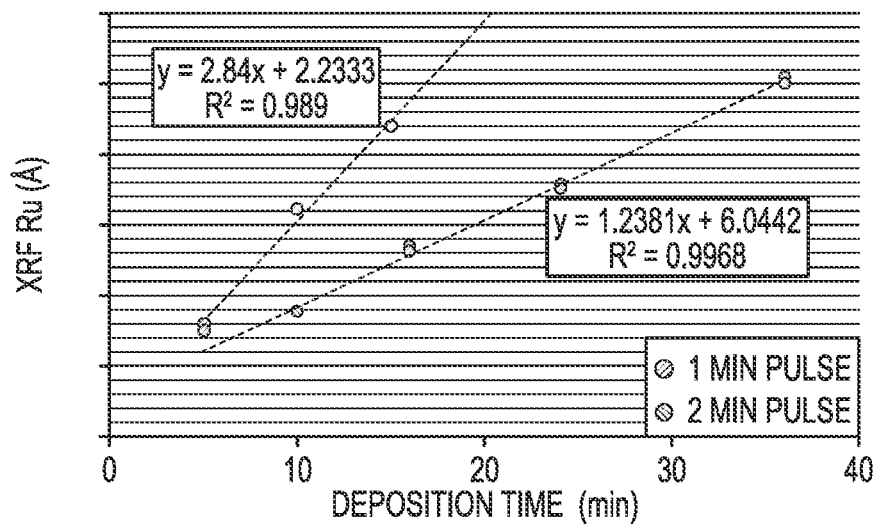
FIG. 3A is a graph of ruthenium deposition using $H_2$ and pulsed $O_2$ co-reactants.

CVD Deposition of Ru Metal Films Using P-Cymene CHD Ru with $H_2$ and $O_2$ Pulse FIG. 3A is a graph demonstrating improved deposition rate using $H_2$ and $O_2$ pulsed in periods of either 1 minute or 2 minutes.

Figure 3B:
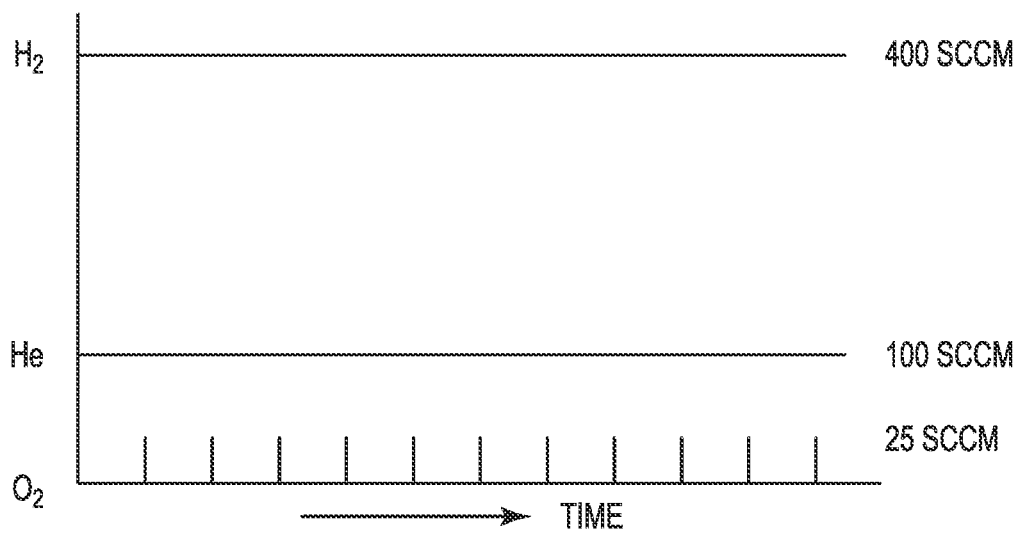
FIG. 3B is a graph illustrating flow rates of gasses during a deposition process using $H_2$ and pulsed $O_2$.

FIG. 3B is a graph illustrating flow rates of gasses during a deposition process using $H_2$ and $O_2$ pulsed.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A method for selectively depositing ruthenium on a substrate in a chemical vapor deposition process comprising:
vaporizing a ruthenium precursor of the Formula I: $R^1R^2Ru(0)$, wherein $R^1$ is an aryl group-containing ligand, and $R^2$ is a diene group-containing ligand; and
contacting the substrate with the vaporized ruthenium precursor and a reducing gas, wherein the substrate comprises a first, conductive material and a second, less conductive material and ruthenium is preferentially deposited on the first, conductive material compared with deposition on the second, less conductive material.

2. The method of claim 1 wherein the ruthenium-containing precursors is of Formula II:

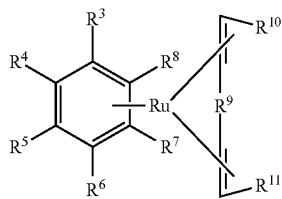

wherein one or more $R^3$-$R^8$ are selected from H and $C_1$-$C_6$ alkyl, $R^9$ is 0 (covalent bond) or a divalent alkene group of 1-4 carbon atoms, and $R^{10}$ and $R^{11}$ form one or more ring structures or are selected from H and $C_1$-$C_6$ alkyl.

3. The method of claim 2 wherein one, two, or three of $R^3$-$R^8$ are selected from $C_1$-$C_3$ alkyl, with the remaining $R^3$-$R^8$ being H.

4. The method of claim 2 wherein $R^9$ is 0 (covalent bond), and $R^{10}$ and $R^{11}$ form one or more ring structures.

5. The method of claim 1, wherein the ruthenium precursor has a total carbon atom amount in the range of 12 to 20.

6. The method of claim 1, wherein the ruthenium precursor has a total hydrogen atom amount in the range of 16 to 28.

7. The method of claim 1, wherein $R^1$ is benzene or a mono-, di-, or tri-alkylbenzene.

8. The method of claim 1, wherein $R^2$ is a cyclic diene.

9. The method of claim 1, wherein $R^2$ is a conjugated diene.

10. The method of claim 1, wherein $R^2$ is cyclohexadiene or an alkylcyclohexadiene.

11. The method of claim 1, wherein the rhenium precursor is selected from the group consisting of (cymene)(1,3-cyclohexadiene)Ru(0), (cymene)(1,4-cyclohexadiene)Ru(0), (cymene)(1-methylcyclohexa-1,3-diene)Ru(0), (cymene)(2-methylcyclohexa-1,3-diene)Ru(0), (cymene)(3-methylcyclohexa-1,3-diene)Ru(0), (cymene)(4-methylcyclohexa-1,3-diene)Ru(0), (cymene)(5-methylcyclohexa-1,3-diene)Ru(0), (cymene)(6-methylcyclohexa-1,3-diene)Ru(0), (cymene)(1-methylcyclohexa-1,4-diene)Ru(0), (cymene)(2-methylcyclohexa-1,4-diene)Ru(0), (cymene)(3-methylcyclohexa-1,4-diene)Ru(0), (cymene)(4-methylcyclohexa-1,4-diene)Ru(0), (cymene)(5-methylcyclohexa-1,4-diene)Ru(0), and (cymene)(6-methylcyclohexa-1,4-diene)Ru(0).

12. The method of any of claim 1, wherein the rhenium precursor is selected from the group consisting of (benzene)(1,3-cyclohexadiene)Ru(0), (toluene)(1,3-cyclohexadiene)Ru(0), (ethylbenzene)(1,3-cyclohexadiene)Ru(0), (1,2-xylene)(1,3-cyclohexadiene)Ru(0), (1,3-xylene)(1,3-cyclohexadiene)Ru(0), (1,4-xylene)(1,3-cyclohexadiene)Ru(0), (p-cymene)(1,3-cyclohexadiene)Ru(0), (o-cymene)(1,3-cyclohexadiene)Ru(0), (m-cymene)(1,3-cyclohexadiene)Ru(0), (cumene)(1,3-cyclohexadiene)Ru(0), (n-propylbenzene)(1,3-cyclohexadiene)Ru(0), (m-ethyltoluene)(1,3-cyclohexadiene)Ru(0), (p-ethyltoluene)(1,3-cyclohexadiene)Ru(0), (o-ethyltoluene)(1,3-cyclohexadiene)Ru(0), (1,3,5-trimethylbenzene)(1,3-cyclohexadiene)Ru(0), (1,2,3-trimethylbenzene)(1,3-cyclohexadiene)Ru(0), (tert-butylbenzene)(1,3-cyclohexadiene)Ru(0), (isobutylbenzene)(1,3-cyclohexadiene)Ru(0), (sec-butylbenzene)(1,3-cyclohexadiene)Ru(0), (indane)(1,3-cyclohexadiene)Ru(0), (1,2-diethylbenzene)(1,3-cyclohexadiene)Ru(0), (1,3-diethylbenzene)(1,3-cyclohexadiene)Ru(0), (1,4-diethylbenzene)(1,3-cyclohexadiene)Ru(0), (1-methyl-4-propylbenzene)(1,3-cyclohexadiene)Ru(0), and (1,4-dimethyl-2-ethylbenzene)(1,3-cyclohexadiene)Ru(0).

13. The method of claim 1, wherein the reducing gas is introduced with the vaporized ruthenium precursor.

14. The method of claim 1, wherein the reducing gas is introduced at least prior to introduction of the vaporized ruthenium precursor.

15. The method of claim 1, wherein the step of contacting the ruthenium precursor and the reducing gas are present in combination in an amount in the range of about 1 µmol:1 L to about 100 µmol:1 L.

16. The method of claim 1, wherein the reducing gas comprises hydrogen, ammonia, or a mixture thereof.

17. The method of claim 1, wherein the step of contacting is carried out at a temperature in the range of 150-400° C.

18. The method of claim 1, wherein the step of contacting is carried out at a pressure in the range of about 0.5 to about 80 Torr.

19. The method of claim 1, wherein the first, conductive material comprises copper and the second, less conductive material comprises silicon dioxide.

20. The method of claim 1, wherein a first deposition rate on the first, conductive material is at least twice a second deposition rate on the second, less conductive material.

* * * * *